US011535508B2

(12) United States Patent
Pavone

(10) Patent No.: US 11,535,508 B2
(45) Date of Patent: Dec. 27, 2022

(54) PRESSURE SENSOR INCLUDING A MICROELECTROMECHANICAL TRANSDUCER AND RELATING PRESSURE-DETECTION METHOD

(71) Applicant: STMICROELECTRONICS S.R.L., Agrate Brianza (IT)

(72) Inventor: Mario Giuseppe Pavone, Giarre (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 299 days.

(21) Appl. No.: 16/799,747

(22) Filed: Feb. 24, 2020

(65) Prior Publication Data

US 2020/0270118 A1 Aug. 27, 2020

(30) Foreign Application Priority Data

Feb. 25, 2019 (IT) ........................ 102019000002663

(51) Int. Cl.
*B81B 3/00* (2006.01)
*G01L 9/00* (2006.01)

(52) U.S. Cl.
CPC .......... *B81B 3/0037* (2013.01); *G01L 9/0054* (2013.01); *B81B 2201/0264* (2013.01)

(58) Field of Classification Search
CPC .......... B81B 3/0037; B81B 2201/0264; G01L 9/0054; G01L 9/0045; G01L 9/0044
See application file for complete search history.

(56) References Cited

U.S. PATENT DOCUMENTS 4,944,187 A 7/1990 Frick et al.
6,713,828 B1 * 3/2004 Chavan ............... B81C 1/00246 257/419
6,968,744 B1 * 11/2005 Silverbrook ............ G01L 9/125 73/718
2013/0036827 A1 * 2/2013 Besling ................. G01L 9/0045 216/13
2015/0260597 A1 9/2015 Pagani
2016/0370242 A1 12/2016 Duqi et al.
2018/0124521 A1 5/2018 Giusti et al.
2019/0031979 A1 10/2019 Tondolo
2019/0316679 A1 10/2019 Warren

FOREIGN PATENT DOCUMENTS

CN 108700482 * 9/2016
WO WO2019099821 * 5/2019

OTHER PUBLICATIONS

"LPS25H—MEMS pressure sensor: 260-1260 hPa absolute digital output barometer", STMicroelectronics Data Sheet, Oct. 2018, 43 pages.
Zhang et al., "Optimization of Packaging Process of Piezoresistive Engine Oil Pressure Sensor", 11$^{th}$ *International Conference on Electronic Packaging Technology & High Density Packaging*, 2010, pp. 1362-1365.

* cited by examiner

*Primary Examiner* — Yasser A Abdelaziez
(74) *Attorney, Agent, or Firm* — Seed IP Law Group LLP

(57) ABSTRACT

A pressure sensor including: a structure which delimits a main cavity of a closed type, the structure being at least partially deformable as a function of a pressure external to the structure; and a MEMS device, which is arranged in the main cavity and generates an output signal, which is of an electrical type and is indicative of the pressure inside the main cavity.

21 Claims, 5 Drawing Sheets d
h1
h0
h1
10
1
S4
4
6
14
8
H
S3
16
2
S2
12
D 4
6
14
12
S4
S2
2
43
S3
42
10
H
44
8
40

4
6
14
12
S4
S2
2
146
S3
42
145
10
8
H
144
40

PRESSURE SENSOR INCLUDING A MICROELECTROMECHANICAL TRANSDUCER AND RELATING PRESSURE-DETECTION METHOD

BACKGROUND

Technical Field

The present disclosure relates to a pressure sensor including a MEMS (MicroElectroMechanical System) transducer and to a corresponding pressure-detection method.

Description of the Related Art

As is known, today there is a strong desire for arranging sensors capable of detecting the pressure exerted by mechanical structures. For instance, this desire is felt in the field of structural monitoring, as well as in other industrial fields (for example, within braking systems for motor vehicles).

It is likewise known that today MEMS sensors are available, which define corresponding cavities, which in use are fluidically coupled to the outside world so as to enable detection of variations of the pressure of the gaseous mass in which the MEMS sensors are immersed. Unfortunately, such MEMS sensors are not suitable for detection of the pressures exerted by solid bodies on account of both their brittleness and on account of the fact that they require the aforementioned fluidic coupling with an external gaseous mass, or in any case a fluid mass, to be established.

BRIEF SUMMARY

An object of the present disclosure is hence to provide a sensor that will at least partly overcome the drawbacks of the prior art.

According to the present disclosure, a pressure sensor is provided. At least one embodiment of the present disclosure is a pressure sensor that includes:

a structure that is at least partially deformable as a function of an external pressure applied to the structure, the structure including a closed main cavity; and a MEMS device, arranged in the main cavity and configured to generate an output signal of an electrical type and indicative of a pressure inside the main cavity.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
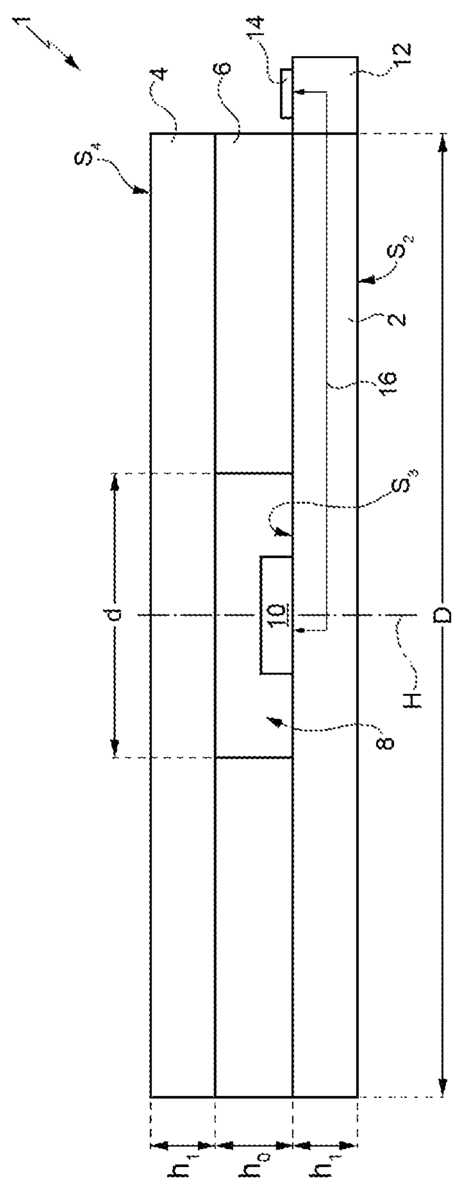
FIG. 1 is a schematic cross-sectional view of an embodiment of the present sensor.

FIG. 1 shows a sensor 1, which comprises a first and a second peripheral region 2,4, and an intermediate region 6, which is arranged between the first and the second peripheral regions 2, 4. As used herein, "region" may include one or more layers of material.

In detail, the first and the second peripheral regions 2, 4 have a cylindrical shape and are formed by laminated material with a high Young's modulus (for example, higher than or equal to 10 GPa), such as, for example, the material known as RO4003, which is made of a plastic resin mixed with ceramic immersed in a woven-glass structure. Moreover, the cylindrical shapes of the first and the second peripheral regions 2, 4 have axes coinciding with an axis H and have bases with a diameter D.

The intermediate region 6 is made of a soft and elastic material, with a low Young's modulus (for example, lower than 1 GPa), for instance, a silicone-based material (e.g., the material known as HT 1250). In particular, the intermediate region 6 has the shape of a hollow cylinder, which has an axis coinciding with the axis H and bases that have the aforementioned diameter D. The intermediate region 6 contacts both the first and the second peripheral regions 2,4 and laterally delimits a cylindrical shaped cavity 8, which has an axis that coincides with the aforementioned axis H; moreover, the bases of the cavity 8 have a diameter d.

The cavity 8, referred to hereinafter as the main cavity 8, is delimited at the bottom by the first peripheral region 2, which is in turn delimited at the bottom by a bottom surface $S_2$. Moreover, the main cavity 8 is delimited at the top by the second peripheral region 4, which is in turn delimited at the top by a top surface $S_4$. Moreover, the main cavity 8 is sealed; i.e., it does not enable gas exchange with the outside world.

In practice, the first and the second peripheral regions 2, 4 and the intermediate region 6 form a structure that delimits the sealed main cavity 8.

In greater detail, the first and the second peripheral regions 2, 4 are regions with high stiffness since the material RO4003 has a Young's modulus value of approximately 19 GPa, whereas the intermediate region 6 forms a region with low stiffness since the material HT 1250 has a Young's modulus value of approximately 10 MPa.

In greater detail, the first and the second peripheral regions 2, 4 may have one and the same shape and therefore may have one and the same thickness, designated by $h_1$. The thickness of the intermediate region 6 is designated by $h_0$.

Purely by way of example, the thickness $h_0$ may range, for example, between 1 mm and 2 mm; the thickness $h_1$ may range, for example, between 2.54 mm and 5.08 mm. Moreover, the diameter D may range, for example, between 25 mm and 35 mm, whereas the diameter d may range, for example, between 5 mm and 15 mm. The volume of the main cavity 8 may range, for example, between 20 $mm^3$ and 60 $mm^3$.

The sensor 1 further comprises a MEMS device 10, which is arranged within the main cavity 8. In particular, the first peripheral region 2 is delimited at the top by an intermediate surface $S_3$, on which the MEMS device 10 is arranged.

The MEMS device 10 is a MEMS sensor of a type in itself known, which is adapted to generate an electrical signal indicative of the pressure present within the main cavity 8, as described in greater detail hereinafter.

The sensor 1 also comprises a projecting region 12, which extends in cantilever fashion from the cylindrical body delimited by the outer side walls of the first and the second peripheral regions 2, 4 and of the intermediate region 6. The projecting region 12 forms a single piece with the first peripheral region 2, has the same thickness as the latter, and is delimited at the top by the aforementioned intermediate surface $S_3$. Moreover, arranged on the projecting region 12 is a plurality of conductive pads 14, visible also in FIG. 2, which are electrically connected to the MEMS device 10 through a plurality of conductive paths 16 (one of which is illustrated schematically in FIG. 1), which extend through the first peripheral region 2. In a way in itself known, the MEMS device 10 includes respective conductive pads (not illustrated), which are electrically connected to the conductive paths 16, for example, by wire bonding (not illustrated).

Figure 3:
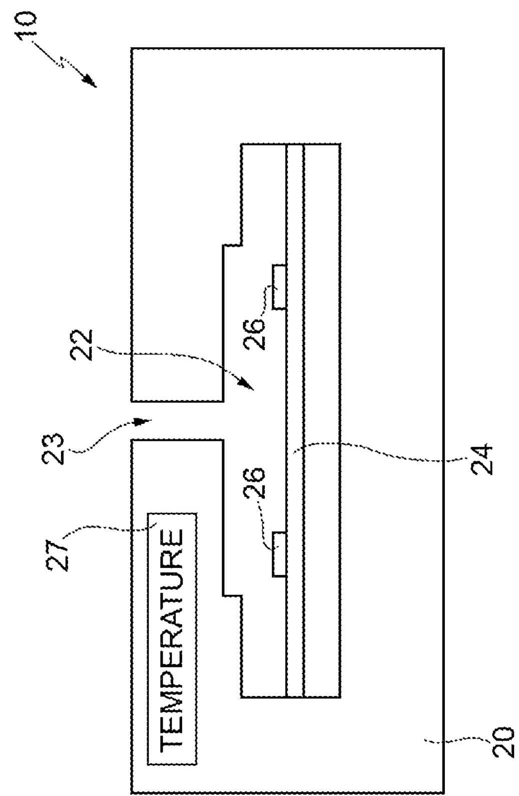
FIG. 3 is a schematic cross-sectional view of a portion of the sensor illustrated in FIG. 1.

In greater detail, and without this implying any loss of generality, the MEMS device 10 may be of the type represented schematically in FIG. 3. In particular, the MEMS device 10 may comprise a fixed structure 20, which delimits a secondary cavity 22, extending in which is a membrane 24, on which transducers 26 are arranged adapted to generate electrical signals indicative of the deformation of the membrane 24. The secondary cavity 22 is fluidically coupled to the main cavity 8, for example by means of a through hole 23, which traverses part of the fixed structure 20 so that the pressure inside the secondary cavity 22 is equal to the pressure of the main cavity 8. Moreover, possible pressure variations that arise inside the main cavity 8 cause corresponding pressure variations inside the secondary cavity 22. In turn, the pressure variations inside the secondary cavity 22 cause consequent deformations of the membrane 24, which are detected by the transducers 26. In a way in itself known, the MEMS device 10 may also comprise an electronic read circuit (not illustrated), electrically coupled to the transducers 26 and adapted to generate an output signal, which is indicative of the pressure in the secondary cavity 22 and is then sent, through the conductive paths 16, to the conductive pads 14, where it can be made available to the outside world, as explained hereinafter.

As illustrated once again in FIG. 3, the MEMS device 10 may also include a temperature sensor 27, for example, fixed with respect to the fixed structure 20 and is adapted to detect the temperature of the main cavity 8. In particular, the temperature sensor 27 generates a temperature signal, which is of an electrical type and is indicative of the temperature of the main cavity 8. Moreover, even though it is not illustrated, the temperature sensor 27 is electrically coupled to corresponding conductive pads 14, through corresponding conductive paths 16 so that also the temperature signal is made available to the outside world.

This having been said, present inside the main cavity 8 is a gas, to which to a first approximation the ideal gas law can be applied; namely, $$P_x * V_x = k * T = P_a * V_0$$

where, neglecting for simplicity the volume of the MEMS device 10, $V_0$ denotes the volume of the main cavity 8 when present inside it is the ambient pressure, designated by $P_a$, this condition arising when the pressure outside of the sensor 1 is also equal to the ambient pressure $P_a$. Moreover, $V_x$ is the volume of the main cavity 8, when a generic pressure $P_x$ is present therein. In addition, k is a constant that depends upon the number of moles of gas and the perfect-gas constant, and T is the temperature of the gas present in the main cavity 8.

Assuming that the temperature of the gas within the main cavity 8 remains constant, then we have:

$$V_x = P_a * V_0 / P_x$$

Figure 4:
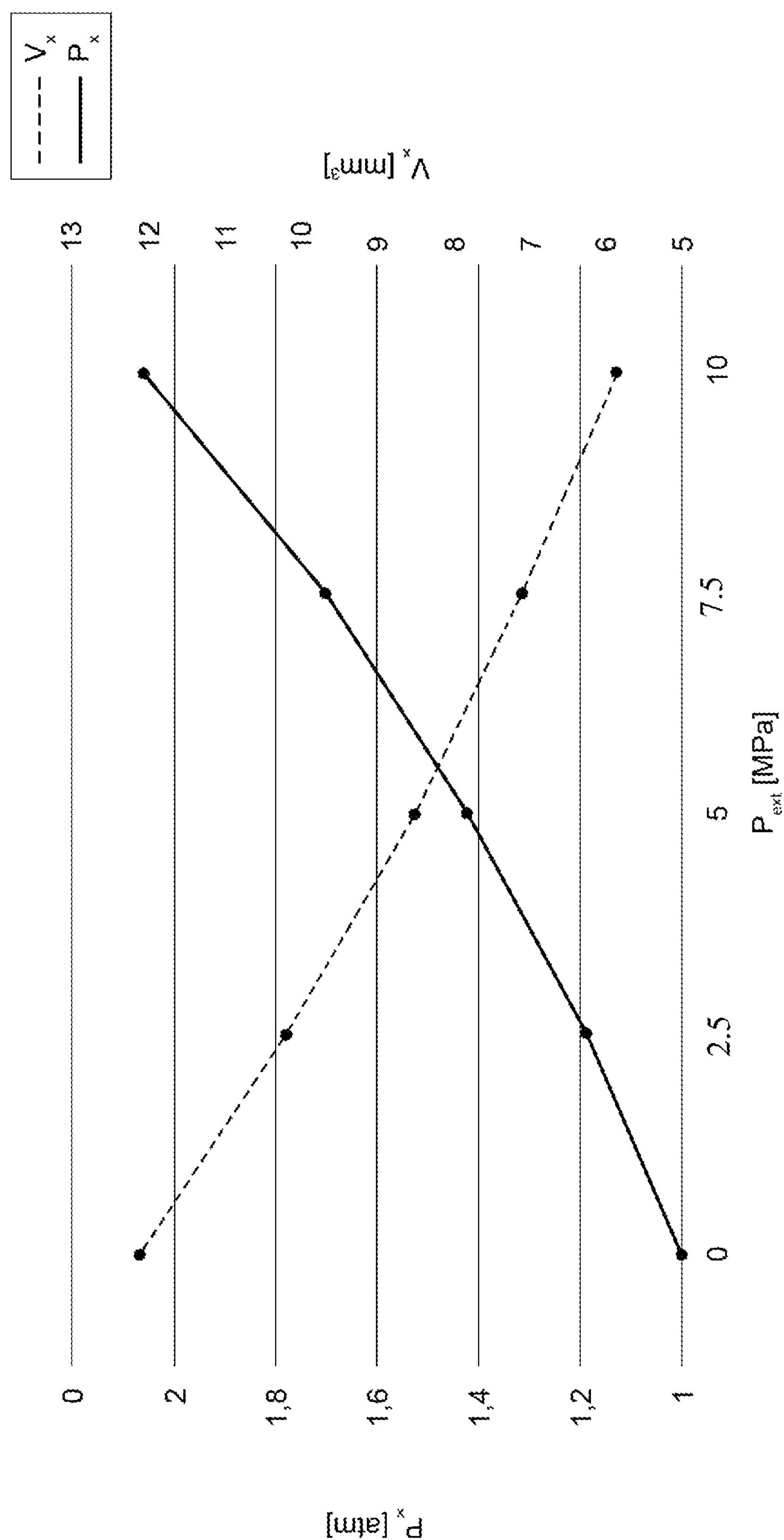
FIG. 4 shows the plots of magnitudes relating to the present sensor, as a function of an external pressure.

This having been said, assuming that the sensor 1 is arranged so that the bottom surface $S_2$ contacts a rigid support and assuming that a uniform external pressure $P_{ext}$ is exerted on the top surface $S_4$, we find that, by setting $P_{ext} = P_a + \Delta P$, the thickness $h_0$ of the intermediate region 6 decreases as $\Delta P$ increases. Consequently, the volume $V_x$ of the main cavity 8 decreases as the pressure $P_x$ increases, as illustrated by way of example in FIG. 4, where it has been assumed that the temperature remains constant. In practice, the output signal generated by the MEMS device 10 is indicative of the value of the volume $V_x$ of the main cavity 8, which in turn depends upon the external pressure $P_{ext}$.

Figure 2:
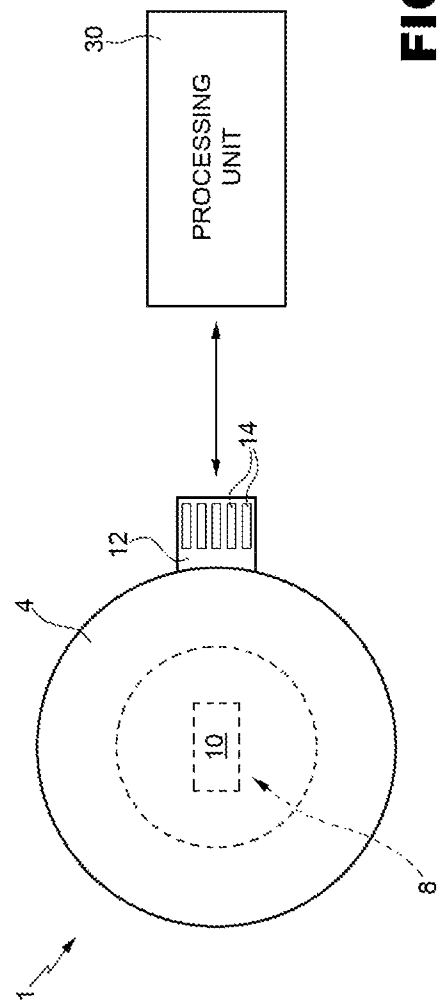
FIG. 2 is a top plan view of the sensor illustrated in FIG. 1.

As illustrated in FIG. 2, the sensor 1, and in particular the conductive pads 24, can be electrically coupled to a processing unit 30, formed, for example, by a microcontroller unit; in this way, the output signal and the temperature signal are supplied to the processing unit 30.

The processing unit 30 can store a data table, in which, given a plurality of temperature sample values, each of these temperature sample values is associated with a corresponding plurality of values of volume of the main cavity 8, each of these values of volume being moreover associated with a corresponding value of the external pressure $P_{ext}$. In this way, on the basis of the temperature of the main cavity 8, represented by the temperature signal, and on the basis of the value of volume $V_x$ of the main cavity 8, represented by the output signal, the processing unit 30 determines a corresponding estimation of the external pressure $P_{ext}$. In this connection, in the case of tensile forces exerted on the sensor 1, the external pressure $P_{ext}$ is lower than the ambient pressure; in order to enable, also in this case, a correct estimation to be obtained, the MEMS device 10 has an operating range that drops below atmospheric pressure (for example, down to approximately 0.2 atm).

By varying the geometry and the materials of the sensor 1, it is possible to vary the operating range of the latter. For instance, if the intermediate region 6 is made of a material having a Young's modulus higher than what has been described previously (for example, in the order of 100 MPa), the operating range increases.

Figure 5:
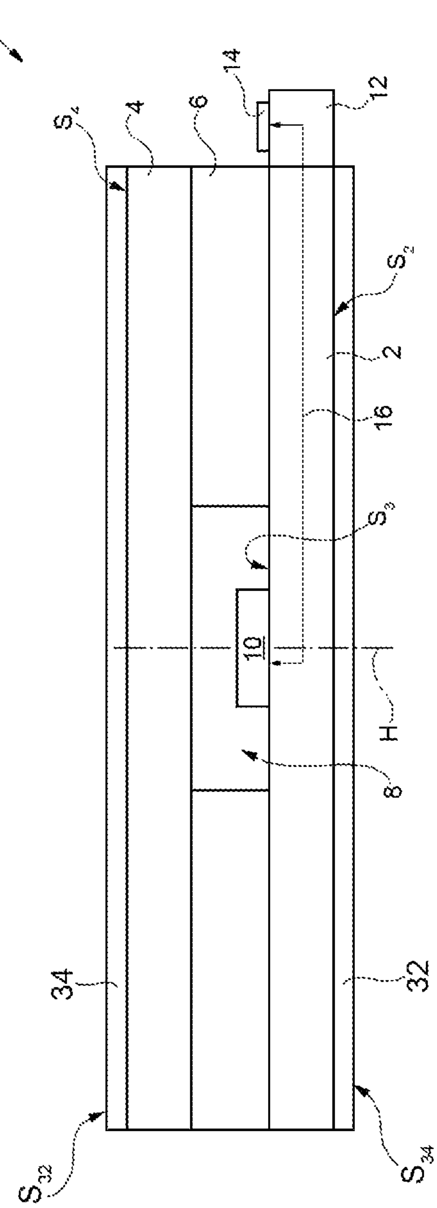
FIGS. 5 to 8 are schematic cross-sectional views of further embodiments of the present sensor.

It is likewise possible to vary the operating range of the sensor 1 by using stiffening elements. For instance, as illustrated in FIG. 5, the sensor may include first and second stiffening regions 32, 34, which are made, for example, of a metal (e.g., copper, which has a Young's modulus value of approximately 110 GPa) or by a ceramic material and are arranged, respectively, below the first peripheral region 2 and above the second peripheral region 4.

In detail, the first stiffening region 32 is delimited at the bottom by an additional bottom surface $S_{32}$, whereas the second stiffening region 34 is delimited at the top by an additional top surface $S_{34}$. Moreover, purely by way of example, each of the first and the second stiffening regions 32, 34 may have a cylindrical shape with a base of diameter D and is aligned along the axis H; moreover, each of the first and the second stiffening regions 32, 34 may have a thickness of the order of the millimetre. In this case, the assembly formed by the first peripheral region 2 and by the first stiffening region 32 is characterised by a greater stiffness than only the first peripheral region 2; similar considerations apply to the second peripheral region 4 and the second stiffening region 34.

In general, the first and the second stiffening regions 32, 34 may be added to each of the embodiments described herein.

Figure 6:
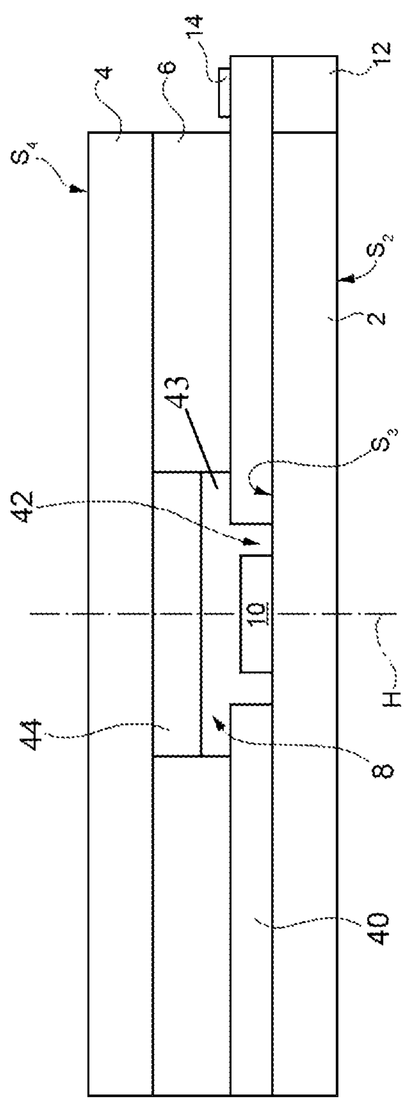

FIG. 6, where for simplicity the conductive paths 16 are no longer illustrated, shows an embodiment in which a first and a second additional region 40,44 are present, which are made, for example, of the same material as that of the first and the second peripheral regions 2, 4.

The first additional region 40 is interposed between the intermediate region 6 and the first peripheral region 2 and has, in top plan view, the same shape as the underlying first peripheral region 2, but has an additional cavity portion 42 of the main cavity 8 so as to leave a portion of the intermediate surface $S_3$ exposed, resting on which is the MEMS device 10, which is hence arranged within the additional cavity portion 42. The additional cavity portion 42 has, for example, a cylindrical shape, is coaxial with a main portion 43 of the main cavity 8, is part of the main cavity, and is laterally delimited by the first additional region 40. Moreover, the bases of the additional cavity portion 42 have a diameter smaller than the diameter d of the main portion of the main cavity 8 in the intermediate region 6. In other words, in a direction perpendicular to the axis H, the additional cavity portion 42 has a section with smaller area than the section of the main portion 43 of the main cavity 8. Moreover, in a direction parallel to the axis H, the additional cavity portion 42 has a height smaller than that of the main portion 43 of the main cavity 8.

The second additional region 44 has a cylindrical shape and is arranged below the second peripheral region 4, with which it is in direct contact, so as to occupy a top portion of the main cavity 8. For instance, the second additional region 44 has bases with a diameter equal to the diameter d so as to contact the intermediate region 6 laterally.

In practice, the volume of the additional cavity portion 42 and of the main portion 43 of the main cavity 8 not occupied by the second additional region 44 is smaller than the volume of the main cavity 8, with consequent increase in sensitivity.

Figure 7:
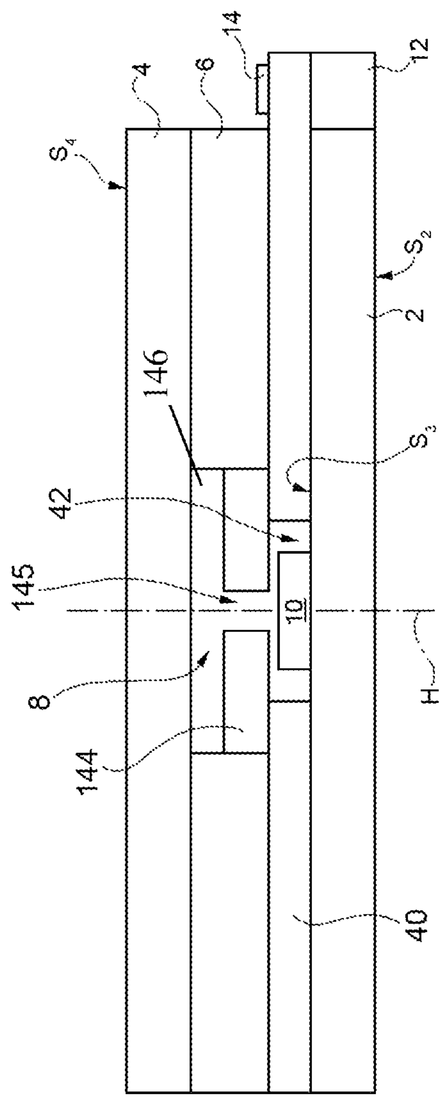

As illustrated in FIG. 7, the second additional region, here designated by 144, may be arranged so as to occupy a bottom portion of the main cavity 8, so as to leave a top portion 146 of the main cavity 8 free, as well as to close the additional cavity portion 42 at the top. In this case, the second additional region 144 has a through hole 145, which sets the additional cavity portion 42 in communication with the top portion of the main cavity 8. In practice, the free top portion 146 of the main cavity 8 allows the second peripheral region 4 to move with greater elasticity.

Figure 8:
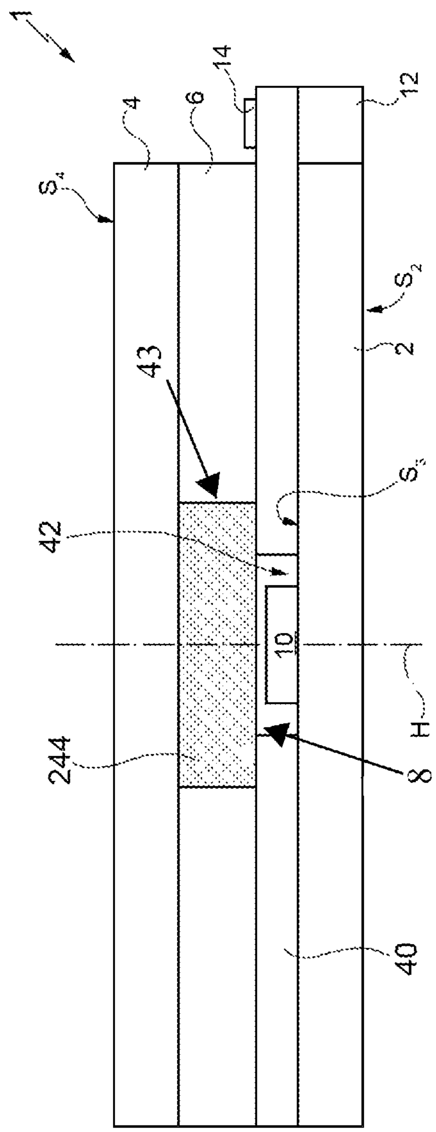

FIG. 8 shows a further embodiment, in which the second additional region, here designated by 244, entirely occupies the main portion 43 of the main cavity 8. Moreover, the second additional region 244 is made of a material with low stiffness (for example, with a Young's modulus value lower than 1 MPa) so as to be less rigid and more deformable than the intermediate region 6. For instance, the second additional region 244 may be made of cellular silicone of a soft type such as BISCO® HT-870. In this case, the considerations set forth previously in regard to the main cavity 8, for example with reference to FIG. 1, apply to the additional cavity portion 42 of the main cavity 8, which is sealed. In particular, as the external pressure increases, there is a deformation of the second additional region 244, which tends to penetrate into the additional cavity portion 42, reducing the volume thereof and, therefore, varying the pressure inside. Thanks to the small volume of the additional cavity portion 42, given the same deformation, the sensitivity is very high.

From what has been described and illustrated previously, the advantages that the present solution affords are evident.

In particular, the present sensor is characterised by a high strength and the capacity of detecting the surrounding pressure, without any need for it to be fluidically coupled to the external environment. In particular, the peripheral regions, which are stiffer, provide protection for the sensor, whereas the intermediate region, which is less stiff and therefore, is greater adapted to undergo deformation (in a substantially elastic way), enables variation of the volume of the main cavity, and therefore also of the pressure inside the main cavity, as a function of the external pressure, which acts on the structure that delimits the main cavity.

Figure 9:
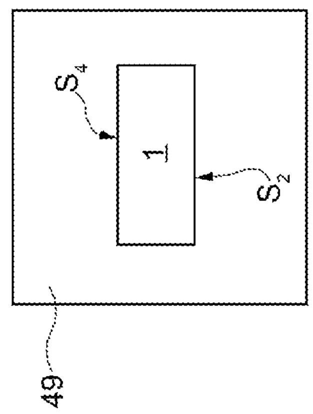
FIG. 9 is a schematic cross-sectional view of a block of cement in which a sensor is embedded.

The present sensor is hence particularly suited for detecting high pressures, such as the pressures that are exerted within a solid body, such as a block of cement 49 illustrated in FIG. 9. In this case, the sensor 1 (for example, of the type designated by 1) can be embedded within the block of cement 49. The part of the block of cement that contacts the sensor 1, and in particular the bottom surface $S_2$ and the top surface $S_4$, exerts a contact pressure on these surfaces, which is detected by the sensor 1.

The present sensor 1 can therefore be used, for example, for the purposes of structural monitoring, or else for detecting the pressure exerted by a braking system. In cases of non-uniform pressures, the pressure sensor 1 detects the average of the pressures exerted above and below the main cavity 8.

In conclusion, it is clear that further modifications and variations may be made to what has been described and illustrated herein, without thereby departing from the scope the present disclosure.

For instance, the first and the second peripheral regions 2, 4 and the intermediate region 6 may have different shapes and/or be made of materials different from what has been described. In particular, reference is made to the first and second materials which indicate the materials that form the first and the second peripheral regions 2, 4, respectively, the materials may have Young's modulus values ranging, for example, between 10 GPa and 200 GPa; moreover, reference is made to the third material which indicates the material that forms the intermediate region 6, the material may have a Young's modulus value ranging, for example, between 0.01 MPa and 100 MPa.

More in general, the embodiments described previously (for example, the geometrical shapes of the cavity) may vary.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pressure sensor comprising:

a structure that is at least partially deformable as a function of an external pressure applied to the structure, the structure including:

a sealed main cavity;

a first peripheral portion and a second peripheral portion that delimit the sealed main cavity; and an intermediate portion that is interposed between the first and the second peripheral portions, that laterally delimits the main cavity, and that has a stiffness lower than a stiffness of the first peripheral portion and lower than a stiffness of the second peripheral portion;

a MEMS device arranged in the sealed main cavity and configured to generate an output signal of an electrical type and indicative of a pressure inside the sealed main cavity.

2. The pressure sensor according to claim 1, wherein the MEMS device includes a membrane that is spaced apart and separated from the first peripheral portion, the second peripheral portion, and the intermediate portion, respectively.

3. The pressure sensor according to claim 1, wherein:

the first peripheral portion comprises a first peripheral region and the second peripheral portion comprises a second peripheral region, the first peripheral region and the second peripheral region being made of a material having a Young's modulus ranging between 10 GPa and 200 GPa; and the intermediate portion is made of a material having a Young's modulus ranging between 0.01 MPa and 100 MPa.

4. The pressure sensor according to claim 3, wherein:

the first peripheral portion further comprises a first stiffening region, mechanically coupled to the first peripheral region, the first peripheral region being interposed between the intermediate portion and the first stiffening region;

the second peripheral portion further comprises a second stiffening region, mechanically coupled to the second peripheral region, the second peripheral region being interposed between the intermediate portion and the second stiffening region;

the first stiffening region has a stiffness greater than the stiffness of the first peripheral region and greater than the stiffness of the second peripheral region; and the second stiffening region has a stiffness greater than the stiffness of the first peripheral region and greater than the stiffness of the second peripheral region.

5. The pressure sensor according to claim 1, further comprising:

a first additional region interposed between the first peripheral portion and the intermediate portion, said first additional region having a stiffness greater than the stiffness of the intermediate portion and laterally delimiting a first portion of the main cavity, the intermediate portion laterally delimiting a second portion of the main cavity opposite to the first portion of the main cavity; and a second additional region which extends into at least a first part of the second portion of the main cavity.

6. The pressure sensor according to claim 5, wherein:

the second portion and the first portion of the main cavity are arranged one overlapping the other along an axis transverse to a first surface of the first peripheral portion and transverse to a second surface of the second peripheral portion which faces the first surface; and in a direction transverse to the axis, the first portion of the main cavity has a cross-section with a smaller area than a cross-section of the second portion of the main cavity.

7. The pressure sensor according to claim 5, wherein:

the second additional region has a stiffness greater than the stiffness of the intermediate portion; and a second part of the second portion of the main cavity is in fluid communication with the first portion of the main cavity through a through hole that extends through the second additional region.

8. The pressure sensor according to claim 5, wherein the second additional region has a stiffness lower than the stiffness of the intermediate portion, the second additional region being configured to deform in response to deformation of the structure and partially penetrate into the first portion of the main cavity.

9. The pressure sensor according to claim 5, wherein the MEMS device is arranged in the first portion of the main cavity.

10. The pressure sensor according to claim 1, wherein the MEMS device comprises:

a fixed structure which delimits a secondary cavity, and the secondary cavity is fluidically coupled to the main cavity;

a membrane which is suspended in the secondary cavity, and the membrane is deformable as a function of a pressure present in the secondary cavity; and a transducer configured to generate an electrical signal that is indicative of a deformation of the membrane.

11. The pressure sensor according to claim 1, wherein the MEMS device further includes a temperature sensor configured to generate a temperature signal indicative of a temperature within the main cavity.

12. A detection system comprising:

a pressure sensor that includes:

- a structure that is at least partially deformable as a function of an external pressure applied to the structure, the structure including:
  - a sealed main cavity;
  - a first peripheral portion and a second peripheral portion that delimit the sealed main cavity; and
  - an intermediate portion that is interposed between the first and the second peripheral portions, that laterally delimits the main cavity, and that has a stiffness lower than a stiffness of the first peripheral portion and lower than a stiffness of the second peripheral portion,
- a MEMS device arranged in the sealed main cavity and configured to generate an output signal of an electrical type and indicative of a pressure inside the sealed main cavity;

a processing unit configured to determine an estimation of the external pressure based on the output signal.

13. The detection system according to claim 12, wherein the MEMS device further includes a temperature sensor configured to generate a temperature signal indicative of a temperature within the main cavity, wherein the processing unit is configured to determine the estimation of the external pressure based on the output signal and on the temperature signal.

14. The detection system according to claim 12, wherein the MEMS device includes a membrane that is spaced apart and separated from the first peripheral portion, the second peripheral portion, and the intermediate portion, respectively.

15. The detection system according to claim 12, wherein:

the first peripheral portion further comprises a first stiffening region, mechanically coupled to the first peripheral region, the first peripheral region being interposed between the intermediate portion and the first stiffening region;

the second peripheral portion further comprises a second stiffening region, mechanically coupled to the second peripheral region, the second peripheral region being interposed between the intermediate portion and the second stiffening region; and the first stiffening region has a stiffness greater than the stiffness of the first peripheral region and greater than the stiffness of the second peripheral region; and the second stiffening region has a stiffness greater than the stiffness of the first peripheral region and greater than the stiffness of the second peripheral region.

16. The detection system according to claim 12, wherein the pressure sensor includes:

a first additional region interposed between the first peripheral portion and the intermediate portion, said first additional region having a stiffness greater than the stiffness of the intermediate portion and laterally delimiting a first portion of the main cavity, the intermediate portion laterally delimiting a second portion of the main cavity opposite to the frist portion of the main cavity; and a second additional region which extends into at least a first part of the second portion of the main cavity.

17. The detection system according to claim 12, wherein the MEMS device comprises:

a fixed structure which delimits a secondary cavity, and the secondary cavity is fluidically coupled to the main cavity;

a membrane which is suspended in the secondary cavity, and the membrane is deformable as a function of a pressure present in the secondary cavity; and a transducer configured to generate an electrical signal that is indicative of a deformation of the membrane.

18. The detection system according to claim 16, wherein:

the second portion and the first portion of the main cavity are arranged one overlapping the other along an axis transverse to a first surface of the first peripheral portion and transverse to a second surface of the second peripheral portion which faces the first surface; and in a direction transverse to the axis, the first portion of the main cavity has a cross-section with a smaller area than a cross-section of the second portion of the main cavity.

19. A device, comprising:

a multi-layer structure including:

a first layer having a first Young's modulus and a first surface;

a second layer having a second Young's modulus and a second surface facing towards the first surface;

a third layer interposed between the first surface of the first layer and the second surface of the second layer, the third layer having a third Young's modulus less than the first and second Young's moduli; and a fourth layer interposed between the second layer and the first layer;

a sealed cavity within the multi-layer structure;

a micro-electromechanical system (MEMS) device within the sealed cavity, the MEMS device is on the first surface of the first layer.

20. The device of claim 19, wherein the MEMS device includes a membrane that is spaced and separated from the first layer, the second layer, the third layer, and the forth layer, respectively.

21. The device of claim 19, wherein:

the multi-layer structure further includes a fifth layer interposed between the fourth layer and the second layer; and the third layer extends around the fifth layer interposed between the fourth layer and the second layer.

* * * * *

UNITED STATES PATENT AND TRADEMARK OFFICE

CERTIFICATE OF CORRECTION

PATENT NO. : 11,535,508 B2
APPLICATION NO. : 16/799747
DATED : December 27, 2022
INVENTOR(S) : Mario Giuseppe Pavone It is certified that error appears in the above-identified patent and that said Letters Patent is hereby corrected as shown below:

In the Claims

Column 9, Line 12, Claim 16:
"the frist portion" should read: --the first portion--.

Column 10, Line 22, Claim 20:
"and the forth" should read: --and the fourth--.

Signed and Sealed this
Sixth Day of June, 2023

Katherine Kelly Vidal

Katherine Kelly Vidal
*Director of the United States Patent and Trademark Office*